(12) United States Patent
Wang

(10) Patent No.: US 10,367,010 B2
(45) Date of Patent: Jul. 30, 2019

(54) ARRAY SUBSTRATE AND DISPLAY DEVICE

(71) Applicant: Wuhan China Star Optoelectronics Technology Co., Ltd., Wuhan, Hubei (CN)

(72) Inventor: Li Wang, Guangdong (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/003,752

(22) Filed: Jun. 8, 2018

(65) Prior Publication Data

US 2019/0096912 A1 Mar. 28, 2019

Related U.S. Application Data

(63) Continuation of application No. PCT/CN2018/072695, filed on Jan. 15, 2018.

(30) Foreign Application Priority Data

Sep. 26, 2017 (CN) .......................... 2017 1 0883532

(51) Int. Cl.
*H01L 27/12* (2006.01)
*H01L 23/528* (2006.01)
(Continued)

(52) U.S. Cl.
CPC ........ *H01L 27/124* (2013.01); *H01L 23/5283* (2013.01); *H01L 27/1262* (2013.01); *G02F 1/1368* (2013.01); *G02F 1/136286* (2013.01); *G02F 2001/136295* (2013.01); *G02F 2202/104* (2013.01); *H01L 27/1222* (2013.01); *H01L 29/78672* (2013.01)

(58) Field of Classification Search
CPC .......................... H01L 27/124; H01L 23/5283
See application file for complete search history.

(56) References Cited

U.S. PATENT DOCUMENTS

2010/0084657 A1 4/2010 Tseng
2015/0372072 A1* 12/2015 Xiong ................. H01L 27/3279
257/40

FOREIGN PATENT DOCUMENTS

CN 104965368 A 10/2015
CN 205067932 U 3/2016
(Continued)

*Primary Examiner* — Yu-Hsi D Sun
(74) *Attorney, Agent, or Firm* — Hauptman Ham, LLP

(57) ABSTRACT

An display device is provided which including a stacked array substrate, a display medium layer and an opposite substrate. The array substrate includes a substrate, and plurality of arrayed thin film transistors and conductor layers disposed on the substrate, the conductor layers have a plurality of gate signal lines for transmitting gate signals, each of the gate signal lines extends along a first direction and connects to the plurality of the thin film transistors disposed along the first direction, resistances of the gate signal lines are decreased along a transmitting direction of the gate signals. It realizes that the actual driving voltages of the gate signal line in respective regions are consistent with the ideal driving voltage by designing a gate signal line with a uniform decrease of resistance in a transmitting direction of the gate signal.

10 Claims, 2 Drawing Sheets

(51) Int. Cl.
   *G02F 1/1368* (2006.01)
   *H01L 29/786* (2006.01)
   *G02F 1/1362* (2006.01)

(56) References Cited

FOREIGN PATENT DOCUMENTS

| | | |
|---|---|---|
| CN | 105807523 A | 7/2016 |
| CN | 205609530 U | 9/2016 |
| CN | 106020530 A | 10/2016 |
| CN | 106154632 A | 11/2016 |
| CN | 107491223 A | 12/2017 |

* cited by examiner

ARRAY SUBSTRATE AND DISPLAY DEVICE

RELATED APPLICATIONS

This application is a continuation application of PCT Application No. PCT/CN2018/072695, filed Jan. 15, 2018, which claims the priority benefit of Chinese Application No. 201710883532.8, filed Sep. 26, 2017, which is herein incorporated by reference in its entirety.

FIELD OF THE DISCLOSURE

The disclosure relates to a display technical field, and more particularly to an array substrate and a display device having the array substrate.

BACKGROUND

With the rapid development of display technology, the requirements for the picture quality of the display device are constantly increasing, and especially the requirement of the uniformity of screen flicker in the display device is getting higher and higher.

Resistor capacitance (RC) delay is one of the main factors causing the uniformity of the screen flicker in the display device. The gate signal line of thin film transistor array substrate in the display device is affected by the RC delay to delay the electrical signal, so that the actual driving voltage in certain positions of the display device does not match the ideal driving voltage. That is, the feedthrough effects of the thin film transistor in respective regions of the gate signal line are inconsistent, resulting in a poor uniformity of the screen flicker of the display device, which seriously affects the quality of the display device and the user experience to the user.

SUMMARY

The present disclosure provides an array substrate and a display device. By designing a gate signal line with a uniform decrease in resistance in the transmitting direction of the gate signal, the actual driving voltage in the array substrate and the display device is consistent with the ideal driving voltage, and the feedthrough effect of the gate The thin film transistor is consistent, so as to achieve the uniformity of the screen flicker.

The present disclosure provides an array substrate. The array substrate comprises a substrate, and a plurality of arrayed thin film transistors and conductor layers being disposed on the substrate, wherein the conductor layers comprise a plurality of gate signal lines for transmitting gate signals, each of the gate signal lines extends along a first direction and connects to the plurality of the thin film transistors disposed along the first direction, resistances of the gate signal lines are decreased along a transmitting direction of the gate signals.

Herein, the resistances of the gate signal lines are uniformly decreased.

Herein, thicknesses of the gate signal lines are gradually increased along the transmitting direction of the gate signals.

Herein, the gate signal line comprises a first end and a second end opposite to each other along the first direction, the first end receives the gate signals before the second end, that is, the gate signal is transmitted from the first end to the second end, a thickness of the first end of the gate signal line is 1500~2500 Å, and a thickness of the second end of the gate signal line is 2500~3500 Å.

Herein, the gate signal line comprises a first end and a second end opposite to each other along the first direction, the first end receives the gate signals before the second end, that is, the gate signal is transmitted from the first end to the second end, a thickness of the first end of the gate signal line is 1900~2100 Å, and a thickness of the second end of the gate signal line is 2900~3100 Å.

Herein, a size of the gate signal line in a second direction is gradually increased along the transmitting direction of the gate signal, the second direction is perpendicular to the first direction.

Herein, the gate signal line comprises a first end and a second end opposite to each other along the first direction, the first end receives the gate signals before the second end, that is, the gate signal is transmitted from the first end to the second end, a size of the first end of the gate signal line in the second direction is 1800~2100 Å, and a size of the second end of the gate signal line in the second direction is 2800~3100 Å.

Herein, a thickness of the gate signal line and a size of the gate signal line in the second direction are both gradually increased along the transmitting direction of the gate signal.

The present disclosure further provides a display device, comprising a stacked array substrate, a display medium layer and an opposite substrate, wherein the array substrate comprises a substrate, and plurality of arrayed thin film transistors and conductor layers disposed on the substrate, the conductor layers comprise a plurality of gate signal lines for transmitting gate signals, each of the gate signal lines extends along a first direction and connects to the plurality of the thin film transistors disposed along the first direction, resistances of the gate signal lines are decreased along a transmitting direction of the gate signals.

Herein, a thickness of the gate signal line and/or a size of the gate signal line in a second direction is gradually increased along a transmitting direction of the gate signal, so as to reduce the resistance of the gate signal line uniformly; or the resistance of the gate signal line is gradually decreased along the transmitting direction of the gate signal.

In summary, the resistance of the gate signal line in the conductor layer of the present disclosure decreases uniformly in the transmitting direction of the gate signal, so that the actual driving voltages in the array substrate and the display device are consistent with the ideal driving voltages, resulting in the feedthrough effects of the gate signal lines in the respective regions are consistent, to achieve the uniformity of the screen flicker.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
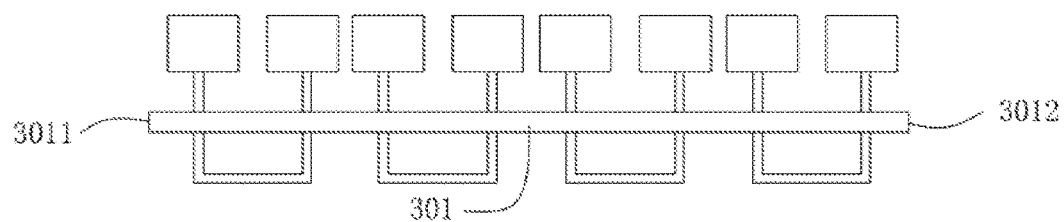
FIG. 1 is a schematic structural diagram of a semiconductor layer and a gate signal line in an array substrate according to an embodiment of the present disclosure.
Figure 2:
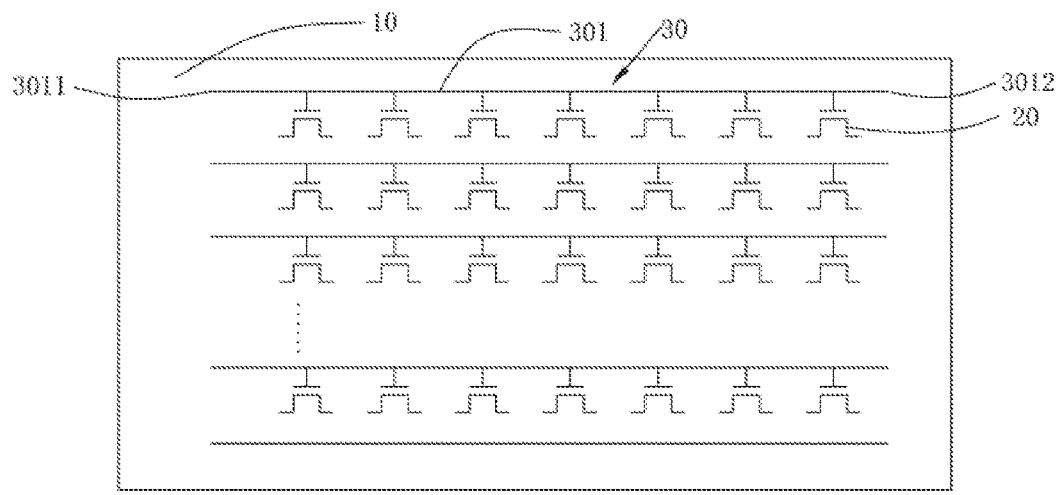
FIG. 2 is a schematic top view of an array substrate structure according to an embodiment of the present disclosure.

Referring to FIG. 1 and FIG. 2, the present disclosure provides an array substrate, which may be a thin film transistor array substrate or a low temperature polysilicon thin film transistor array substrate. The array substrate comprises a substrate 10 and a plurality of arrayed thin film transistors 20 and conductor layers 30 disposed on the substrate 10. The conductor layer 30 comprises a plurality of gate signal lines 301 for transmitting gate signals, each of the gate signal lines 301 extends along a first direction and connects to the plurality of thin film transistors 20 disposed along the first direction, and resistances of the gate signal lines 301 are decreased along a transmitting direction of the gate signals.

In this embodiment, thicknesses of the gate signal lines 301 are gradually increased along the transmitting direction of the gate signals, thereby causing the resistance of the gate signal line 301 to be uniformly reduced along the transmitting direction of the gate signal. Further, the first direction is the transmitting direction of the gate signal.

Figure 3:
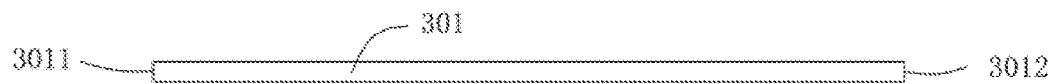
FIG. 3 is a structure diagram of the gate signal line according to FIG. 1.

Please refer to FIG. 3, the gate signal line 301 comprises a first end 3011 and a second end 3012 opposite to each other along the first direction, the first end 3011 receives the gate signals before the second end 3012, that is, the gate signal is transmitted from the first end 3011 to the second end 3012. The thickness of the first end 3011 of the gate signal line is 1500~2500 Å, and the thickness of the second end 3012 of the gate signal line is 2500~3500 Å.

Preferably, the thickness of the first end 3011 of the gate signal line 301 is 1900~2100 Å, and the thickness of the second end 3012 of the gate signal line 301 is 2900~3100 Å.

In this embodiment, the thickness of the gate signal line 301 is uniformly increased along the transmitting direction of the gate signal by using the halftone exposure and development etching process, so that the resistance of the gate signal line 301 is reduced evenly. Specifically, when etching the non-reserved region of the conductor layer 30, the size of the reserved region of the conductor layer 30 in the thickness direction is gradually reduced until the reserved region is penetrated, so that more gate signal lines 301 are exposed to form the gate signal lines 301 having different thicknesses. The beneficial effect is that the thickness of the gate signal line 301 increases uniformly along the transmitting direction of the gate signal and further causes the resistance of the gate signal line 301 to be uniform decreased along the transmitting direction of the gate signal. The actual driving voltages of the gate signal line 301 in respective regions are consistent with the ideal driving voltage, so that the feedthrough effect at the output end of the gate signal line 301 and the feedthrough effect at a position away from the output end of the gate signal line 301 are as consistent as possible. Therefore, the feedthrough effects in the respective regions of the gate signal lines 301 of the array substrate are consistent.

Furthermore, a material of the gate signal line 301 is molybdenum.

Further, the thin film transistor 20 includes a gate formed on a conductor layer, a gate insulating layer covering the conductor layer, a semiconductor layer disposed on the gate insulating layer, a source/drain layer disposed on the semiconductor layer, and an insulating protective layer covering the source/drain layer. The source/drain layer comprises a source electrode and a drain electrode, and the source electrode and a drain electrode are disposed at intervals.

Figure 4:
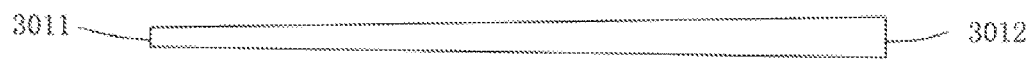
FIG. 4 is a structural diagram of another state of the gate signal line according to FIG. 1.

Please refer to FIG. 4, in a second embodiment of the present disclosure, the size of the gate signal line in a second direction is gradually increased along the transmitting direction of the gate signal, so that the resistance of the gate signal line 301 decreases uniformly along the transmitting direction of the gate signal. Further, the first direction is the transmitting direction of the gate signal, and the second direction is a direction perpendicular to the first direction in FIG. 4.

The gate signal line 301 comprises a first end 3011 and a second end 3012 opposite to each other along the first direction, the first end 3011 receives the gate signals before the second end 3012, that is, the gate signal is transmitted from the first end 3011 to the second end 3012. The size of the first end 3011 of the gate signal line 301 in the second direction is 1800~2100 Å, and the size of the second end 3012 of the gate signal line 301 in the second direction is 2800~3100 Å.

In this embodiment, the size of the gate signal line 301 in the second direction is uniformly increased along the transmitting direction of the gate signal by using the halftone exposure and development etching process, so that the resistance of the gate signal line 301 is reduced evenly. Specifically, when etching the non-reserved region of the conductor layer 30, the size of the reserved region of the conductor layer 30 in the second direction is gradually reduced until the reserved region is penetrated, so that more gate signal lines 301 are exposed to form the gate signal lines 301 having different sizes in the second direction. The beneficial effect is that the size of the gate signal line 301 in the second direction increases uniformly along the transmitting direction of the gate signal, and further causes the resistance of the gate signal line 301 to be uniform decreased along the transmitting direction of the gate signal. The actual driving voltages in respective regions of the gate signal line 301 are consistent with the ideal driving voltage, so that the feedthrough effect at the output end of the gate signal line 301 and the feedthrough effect at a position away from the output end of the gate signal line 301 are as consistent as possible. Therefore, the feedthrough effects in the respective regions of the gate signal lines 301 of the array substrate are consistent.

Furthermore, a material of the gate signal line 301 is molybdenum.

Further, the thin film transistor 20 includes a gate formed on a conductor layer, a gate insulating layer covering the conductor layer, a semiconductor layer disposed on the gate insulating layer, a source/drain layer disposed on the semiconductor layer, and an insulating protective layer covering the source/drain layer. The source/drain layer comprises a source electrode and a drain electrode, and the source electrode and a drain electrode are disposed at intervals.

In a third embodiment of the present disclosure, the thickness of the gate signal line and the size of the gate signal line in a second direction are gradually increased along the transmitting direction of the gate signal, so that the resistance of the gate signal line 301 decreases uniformly along the transmitting direction of the gate signal. Further, the first direction is the transmitting direction of the gate signal, and the second direction is a direction perpendicular to the first direction.

The gate signal line 301 comprises a first end 3011 and a second end 3012 opposite to each other along the first direction, the first end 3011 receives the gate signals before the second end 3012, that is, the gate signal is transmitted from the first end 3011 to the second end 3012. The thickness of the first end 3011 of the gate signal line 301 is 1500~2500 Å, the size of the first end 3012 of the gate signal line 301 in the second direction is 1800~2100 Å, the thickness of the second end 3012 of the gate signal line 301 is 2500~3500 Å, and the size of the second end 3012 of the gate signal line 301 in the second direction is 2800~3100 Å.

In this embodiment, the thickness of the gate signal line 301 and the size of the gate signal line 301 in the second direction are uniformly increased along the transmitting direction of the gate signal by using the halftone exposure and development etching process, so that the resistance of the gate signal line 301 is reduced evenly. Specifically, when etching the non-reserved region of the conductor layer 30, the sizes of the reserved region of the conductor layer 30 along the thickness direction and the second direction are gradually reduced until the reserved region is penetrated, so that more of the gate signal lines 301 are exposed to form the gate signal lines 301 having different thicknesses and sizes in the second direction. The beneficial effect is that the thickness of the gate signal line 301 and the size of the gate signal line 301 in the second direction increase uniformly along the transmitting direction of the gate signal, and further cause the resistance of the gate signal line 301 to be uniform decreased along the transmitting direction of the gate signal. The actual driving voltages in respective regions of the gate signal line 301 are consistent with the ideal driving voltage, so that the feedthrough effect at the output end of the gate signal line 301 and the feedthrough effect at a position away from the output end of the gate signal line 301 are as consistent as possible. Therefore, the feedthrough effects in the respective regions of the gate signal lines 301 of the array substrate are consistent.

Furthermore, a material of the gate signal line 301 is molybdenum.

Further, the thin film transistor 20 includes a gate formed on a conductor layer, a gate insulating layer covering the conductor layer, a semiconductor layer disposed on the gate insulating layer, a source/drain layer disposed on the semiconductor layer, and an insulating protective layer covering the source/drain layer. The source/drain layer comprises a source electrode and a drain electrode, and the source electrode and a drain electrode are disposed at intervals.

In a fourth embodiment of the present disclosure, the thickness of the gate signal line 301 and the size in the second direction are unchanged, and the resistivity of the gate signal line 301 is gradually decreased along the transmitting direction of the gate signal. So that the resistance of the gate signal line 301 is uniformly reduced, the actual driving voltages of the gate signal line 301 in respective regions are consistent with the ideal driving voltages, so as to further realize the same feedthrough effect of the gate signal line 301 in respective regions.

Figure 5:
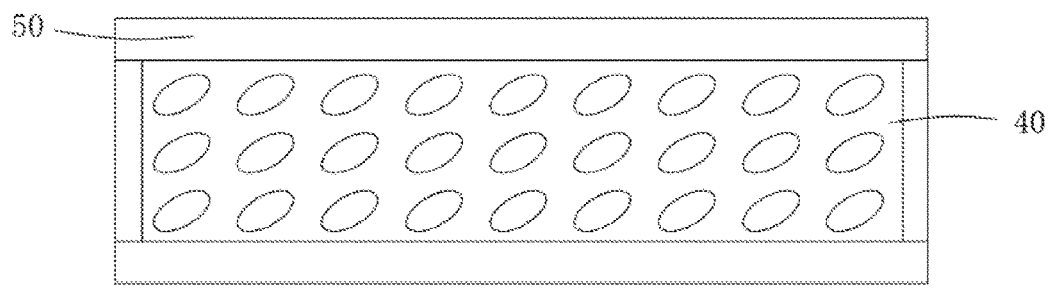
FIG. 5 is a schematic structural diagram of a display device according to an embodiment of the present disclosure.

Please refer to FIG. 5, the present disclosure further provides a display device. The display device comprises a stacked array substrate, a display medium layer 40 and an opposite substrate 50. The array substrate comprises a substrate 10, and plurality of arrayed thin film transistors 20 and conductor layers 30 disposed on the substrate. The conductor layers 30 comprise a plurality of gate signal lines 301 for transmitting gate signals, each of the gate signal lines 301 extends along a first direction and connects to the plurality of the thin film transistors 20 disposed along the first direction, resistances of the gate signal lines 301 are decreased along a transmitting direction of the gate signals.

The thickness of the gate signal line 301 and the size of the gate signal line in a second direction are gradually increased along the transmitting direction of the gate signal, so as to reduce the resistance of the gate signal line 301 uniformly; or the resistance of the gate signal line 301 is gradually decreased along the transmitting direction of the gate signal.

Furthermore, the display medium layer 40 can control the brightness of light emitted from the display screen by twisting. The counter substrate 50 combined with the display medium layer 40 can adjust the brightness of the three primary colors to obtain a desired color display. The beneficial effects are that the thickness of the gate signal line 301 and the size of the gate signal line in the second direction are uniformly increased in the transmitting direction of the gate signal, or the resistivity of the gate signal line 301 is increased along the transmitting direction of the gate signal, thereby resulting in the resistance of the gate signal line 301 is decreased uniformly in the transmitting direction of the gate signal, so as to realize the actual driving voltage and the ideal driving of the gate signal line 301 in respective regions are consistent, and the feedthrough effects of the gate signal lines 301 of the display device in the respective regions are consistent, resulting in a uniform screen flicker of the display device.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An array substrate, comprising a substrate, and a plurality of arrayed thin film transistors and conductor layers being disposed on the substrate, wherein the conductor layers comprise a plurality of gate signal lines for transmitting gate signals, each of the gate signal lines extends along a first direction and connects to the plurality of the thin film transistors disposed along the first direction, resistances of the gate signal lines are decreased along a transmitting direction of the gate signals.

2. The array substrate according to claim 1, wherein the resistances of the gate signal lines are uniformly decreased.

3. The array substrate according to claim 1, wherein thicknesses of the gate signal lines are gradually increased along the transmitting direction of the gate signals.

4. The array substrate according to claim 3, wherein the gate signal line comprises a first end and a second end opposite to each other along the first direction, the first end receives the gate signals before the second end, a thickness of the first end of the gate signal line is 1500~2500 Å, and a thickness of the second end of the gate signal line is 2500~3500 Å.

5. The array substrate according to claim 3, wherein the gate signal line comprises a first end and a second end opposite to each other along the first direction, the first end receives the gate signals before the second end, a thickness of the first end of the gate signal line is 1900~2100 Å, and a thickness of the second end of the gate signal line is 2900~3100 Å.

6. The array substrate according to claim 1, wherein a size of the gate signal line in a second direction is gradually increased along the transmitting direction of the gate signal, the second direction is perpendicular to the first direction.

7. The array substrate according to claim 6, wherein the gate signal line comprises a first end and a second end opposite to each other along the first direction, the first end receives the gate signals before the second end, a size of the first end of the gate signal line in the second direction is 1800~2100 Å, and a size of the second end of the gate signal line in the second direction is 2800~3100 Å.

8. The array substrate according to claim 1, wherein a thickness of the gate signal line and a size of the gate signal line in a second direction are both gradually increased along the transmitting direction of the gate signal, the second direction is perpendicular to the first direction.

9. A display device, comprising a stacked array substrate, a display medium layer and an opposite substrate, wherein the array substrate comprises a substrate, and plurality of arrayed thin film transistors and conductor layers disposed on the substrate, the conductor layers comprise a plurality of gate signal lines for transmitting gate signals, each of the gate signal lines extends along a first direction and connects to the plurality of the thin film transistors disposed along the first direction, resistances of the gate signal lines are decreased along a transmitting direction of the gate signals.

10. The display device according to claim 9, wherein a thickness of the gate signal line and/or a size of the gate signal line in a second direction is gradually increased along a transmitting direction of the gate signal, so as to reduce the resistance of the gate signal line uniformly, the second direction is perpendicular to the first direction; or the resistance of the gate signal line is gradually decreased along the transmitting direction of the gate signal.

* * * * *